United States Patent
Mandal et al.

[11] Patent Number: 5,112,881
[45] Date of Patent: May 12, 1992

[54] PHOTOCROSSLINKED SECOND ORDER NONLINEAR OPTICAL POLYMERS

[75] Inventors: Braja K. Mandal, Lowell; Sukant K. Tripathy, Acton; Jan-Chan Huang; Jayant Kumar, both of Lowell, all of Mass.

[73] Assignee: University of Lowell, Lowell, Mass.

[21] Appl. No.: 573,253

[22] Filed: Aug. 24, 1990

[51] Int. Cl.$^5$ .................... C08J 3/28; C08F 265/00; G03C 1/725
[52] U.S. Cl. .................... 522/117; 522/34; 522/49; 522/63; 525/293; 430/281; 430/285; 430/287
[58] Field of Search .................... 522/117, 34, 49, 63; 525/293; 430/287, 285, 281, 919

[56] References Cited
U.S. PATENT DOCUMENTS 4,164,421 8/1979 Shinozaki et al. .................... 430/192
4,792,208 12/1988 Ulman et al. .................... 430/321

FOREIGN PATENT DOCUMENTS 0313475 6/1988 European Pat. Off. .
0313476 9/1988 European Pat. Off. .
0321891 12/1988 European Pat. Off. .

OTHER PUBLICATIONS

M. A. Mortazavi, et al., *J. Opt. Soc. Am. B*, 6(4): 733-741 (1989).
M. Eich et al., *J. Appl. Phys.*, 66(7): 3241-3247 (1989).
B. Reck et al., *SPIE*, 1147: 74-83 (1989).
K. D. Singer et al., *Appl. Phys. Lett.*, 53: 1800-1802 (1988).

*Primary Examiner*—Marion E. McCamish
*Assistant Examiner*—Mark A. Chapman
*Attorney, Agent, or Firm*—Hamilton, Brook, Smith & Reynolds

[57] ABSTRACT

A novel photocrosslinkable polymeric system has been developed for processing into films having stable second-order nonlinear optical properties. In the present system, polymers bearing photo-crosslinkable chromophores, such as polyvinylcinnamate and are reacted with appropriately designed nonlinear optical molecules with the cinnamate or other photocrosslinkable functionalities for photocrosslinking at one, two or more points. The system can be poled and photocrosslinked in the poled state to yield a material with stable optical nonlinearity and large electro-optic coefficients.

14 Claims, 3 Drawing Sheets

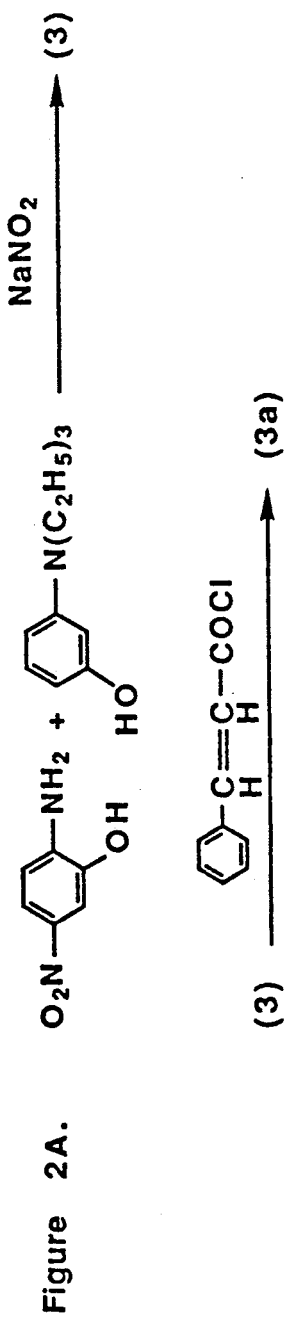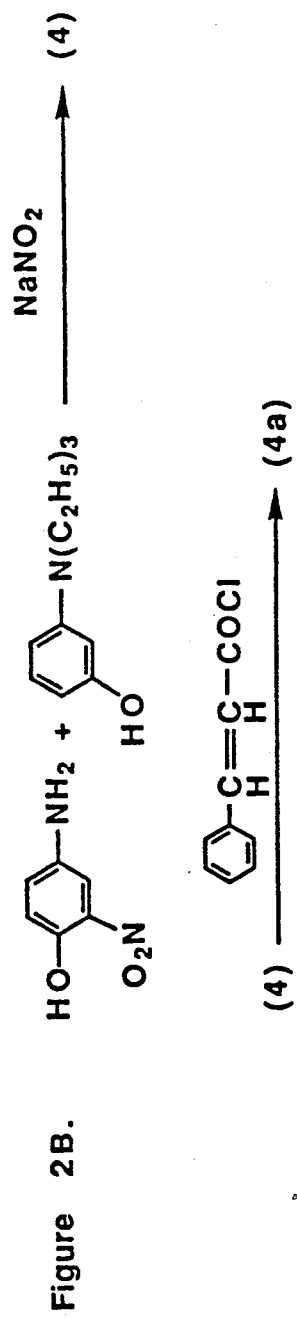
Figure 2A.
Figure 2B.

PHOTOCROSSLINKED SECOND ORDER NONLINEAR OPTICAL POLYMERS

BACKGROUND OF THE INVENTION

Second order nonlinear optical (NLO) polymers are expected to find extensive uses in opto-electronic applications. NLO polymers have several advantages over single crystalline inorganic and organic molecular systems. These include easy preparation, adjustable refractive indices and controlled arrangement of spatial order. For second order applications it is imperative that the material be noncentrosymmetric. In noncentrosymmetric organizations several organic molecular and polymeric systems have been characterized by large second order NLO coefficients, ultra-fast response times, performance over a broad wavelength range and high laser damage threshold compared to the traditional inorganic materials, e.g., lithium niobate ($LiNbO_3$) or potassium dihydrogenphosphate ($KH_2PO_4$). Background information relating to the principles of nonlinear optical polymers, is contained in "Nonlinear Optical and Electroactive Polymers", edited by Prasad and Ulrich, Plenum Press, (1988).

A number of applications, such as second harmonic generation (SHG), frequency mixing, electro-optic modulation, optical parametric emission, amplification and oscillation have been proposed for organic and polymeric materials with large second order NLO coefficients. R. D. Small et al., "Molecular and Polymeric Optoelectronic Materials: Fundamentals and Applications", edited by Khanarian, SPIE, 682:160 (1986). A number of approaches have been made in the past decade to organize NLO molecules in a polymer matrix in a noncentrosymmetric manner. The most important, but not the only aspect from the standpoint of application, is the organization of NLO molecules into preferred orientation and their stability in the aligned state up to at least cold wire bond temperatures (about 100° C.).

Historically, one of the first approaches to this alignment of NLO molecules in a polymeric system came with the concept of the "guess-host" system. Singer et al., Appl. Phys. Let., 49:248 (1986). The NLO molecules may be incorporated by a solution casting method with an amorphous polymer and the second order nonlinearity may be imparted by subsequent poling of the NLO molecules in the matrix using an external electric field, e.g., corona poling, parallel plate poling or integrated electrode poling. Advantages of this approach are ease of processing, tailorable refractive indices, control of spatial ordering of the polymer, and choice of a wide range of materials. However, the decay (both the initial and long term) of second order properties as confirmed through SHG from the matrix is unavoidable when the poling field is withdrawn from the matrix. Moreover, a high degree of loading of the NLO molecules in the polymer is not possible because of phase segregation of the matrix or blooming of NLO molecules in the matrix, both resulting in optical scattering.

In a second approach, known as "grafted" systems, a number of new features are routed just by linking NLO molecules covalently in the side chains of a suitable polymer backbone. Meredith et al., Macromolecules, 15:1385 (1982). Despite the synthetic complexity of such a system, a large number of NLO molecules (a concentration 2 to 3 times greater than the guest-host system) can be coupled with the polymer side chains, yet the polymers are easily processable. Both the initial and long term decay in second harmonic (SH) properties are reduced to a great extent.

Recently, a three dimensional network consisting of NLO molecules, known as the "cross-linked" system, has been developed to overcome a number of problems associated with the guest-host or grafted systems. Reck et al., SPIE, 1147:74 (1989) and Eich et al., J. Appl. Phys., 66(7):3241 (1989). In this system, multifunctional epoxy and amino compounds containing NLO components are simultaneously processed, poled and cross-linked to freeze-in the nonlinear effects permanently. Properties resulting from the cross-linked system are significantly small decay in SH properties over a long period of time and the ability for processing with large concentrations of NLO molecules. However, for developing an optimal epoxy based NLO material precise control of the molecular weight of the prepolymer is a stringent and necessary condition. In addition, poling and curing at elevated temperatures has to be carried out over a long period of time (about 20 hours) making processing of the materials significantly difficult.

SUMMARY OF THE INVENTION

The invention relates to a novel three-dimensional polymer matrix comprising noncentrosymmetrically aligned NLO molecules. The present polymers are prepared by photochemical reactions between photosensitive chromophores which have been functionalized into NLO molecules and the same or related chromophores appended into a host polymer acting as the matrix.

The functionalized NLO molecules are at least difunctional, and form crosslinks with the chromophores in the polymer to form the desired three-dimensional crosslinked network. In one embodiment, an extended $\pi$-conjugated diazo dye system substituted with donor-acceptor groups, and cinnamate groups, at either end are used as model NLO molecules and polyvinylcinnamate (PVCN) is used as the model host polymer for the demonstration of the present invention. The cinnamate groups attached to the NLO molecules and the pendant cinnamate groups on the PVCN polymer are photo-crosslinked, for example, by exposure to ultra-violet (UV) radiation, thereby forming a three-dimensional crosslinked network.

The present polymers may be cast in bulk or as films. Thin films of the present polymers can be produced, for example, by spin-coating from a solution containing the NLO molecules and the host polymer in an organic solvent or mixture of organic solvents. A wide range of solvents or solvent mixtures can be used for spin-coating.

The cast film is then poled to introduce noncentrosymmetric organization of the NLO molecules in the polymer film. This can be accomplished by exposing the film to an electric field, for example, by corona poling. The poling temperature is usually close to the glass transition temperature ($T_g$) of the polymer. The process conditions are specific to the system and can be established using the appropriate routine protocol.

The NLO molecules are then permanently frozen-in into the preferred orientation by crosslinking. Crosslinking is performed photochemically, for example, by exposure to UV irradiation. Poling and crosslinking can be performed as independent steps, or simultaneously.

Noncentrosymmetric polymer films produced as described herein have several advantages. They are easy to prepare, exhibit ultra-fast response times, are stable at elevated temperatures, perform over a broad wavelength range and have a high laser damage threshold. Also the process of poling is independent of the cross-linking process and they can be superimposed in a desired manner.

BRIEF DESCRIPTION OF THE FIGURES

FIG. 2 is a schematic illustration showing the process for synthesizing cinnamate-functionalized NLO molecules. Scheme A illustrates the synthesis of 3-cinnamoyloxy-4-[4-(N,N-diethylamino)-2-cinnamoyloxyphenylazo] nitrobenzene and Scheme B illustrates the synthesis of 6-cinnamoyloxy-3-[4-(N,N-diethylamino)-2-cinnamoyloxyphenylazo] nitrobenzene.

DETAILED DESCRIPTION OF THE INVENTION

Figure 1:
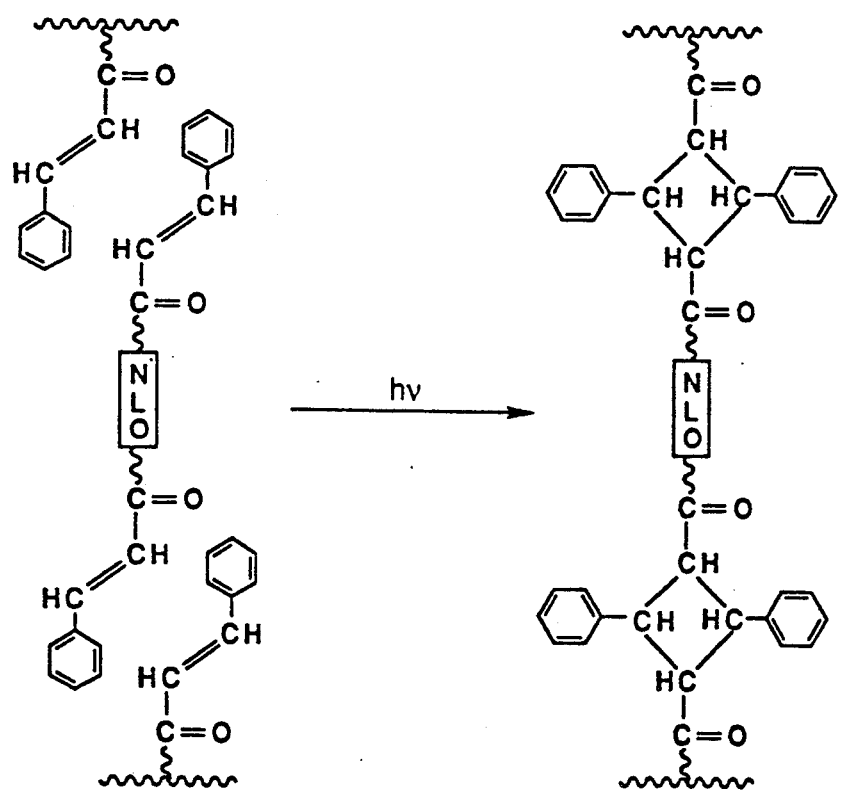
FIG. 1 is a schematic illustration of the photocross-linking reaction between a cinnamate-functionalized conjugated NLO molecule and polyvinylcinnamate.

The present polymers are prepared by reacting photo-reactive chromophores which are attached to NLO molecules with the same or related chromophores which are attached to a polymer forming the matrix. The term "NLO molecules" as used herein means molecules possessing second order nonlinear optical properties.

The NLO molecules are generally organic molecules possessing donor-acceptor groups. Organic molecules which possess donor-acceptor groups attached to an aromatic ring, which improve charge transfer through $\pi$-electron delocalization, and which exhibit second order NLO properties, are particularly useful as NLO molecules. Organic molecules having these properties are shown schematically below as Formula 1, and a specific compound, p-nitroaniline, is shown where the donor group (D) is an amine group ($NH_2$) and the acceptor group (A) is a nitro group ($NO_2$).

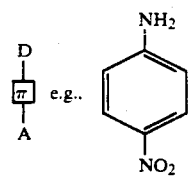

The terms "donor" and "acceptor" as used herein refer to functional groups which either "donate" or "accept" $\pi$ electrons, respectively. The nitro group ($NO_2$) is the preferred $\pi$-acceptor although other groups such as cyano (CN) are also used. As a $\pi$-donor, nitrogen in the form of an amine group ($NH_2$) is preferred, although donor groups attached through other atoms such as oxygen, can also be employed. For example, donor groups which are useful in the present NLO molecules include, in addition to amine ($NH_2$), N,N-dimethylamine ($N(CH_3)_2$), N,N-diethylamine ($N(C_2H_5)_2$), methoxy ($-OCH_3$) and ethoxy ($-OCH_2CH_3$). Useful acceptor groups, in addition to nitro ($NO_2$) and cyano (CN), include pyridinium salts and N-oxide.

The $\pi$ moiety can be any system rich in $\pi$ electrons, such as a bezene ring. A bezene ring having substituents, such as hydroxy groups, which do not interfere with or which enhance the donor and acceptor characteristics of the ring system can also be used.

In a preferred embodiment of the present invention, conjugated $\pi$-extended NLO molecules are used. Efficient second order properties are obtained using NLO molecules having an extended conjugated $\pi$-electron system with an asymmetric charge distribution provided by donor-acceptor groups at either end of the conjugated system. A conjugated $\pi$-extended NLO molecule is shown schematically below as Formula 2,

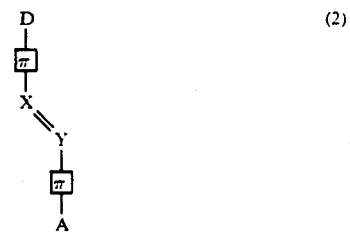

wherein X and Y represent the linking atoms to the acceptor (A) and donor (D) groups, respectively. For example, diazo, stilbene, and azomethine are useful conjugated NLO molecules, wherein X and Y are the moieties shown in Table 1.

TABLE 1

| | X | Y |
|---|---|---|
| DIAZO | N | N |
| STILBENE | CH | CH |
| AZOMETHINE | CH | N |
| | | or |
| | N | CH |

A method for producing conjugated NLO molecules is described in detail in Example 1. Higher magnitudes of the nonlinear effects in appropriate molecular arrangements can be obtained by molecular engineering and synthetic tailoring.

Any NLO molecule to which photosensitive chromophores may be attached at one, two or more points can be used in the present process. The photosensitive chromophores are best attached through hydroxyl groups present in the NLO molecule. One of the easiest ways to attach photosensitive chromophores such as, cinnamate, to the NLO molecules is by esterification of hydroxyl groups by cinnamoyl chloride ($C_6H_5-CH=CH-COCl$).

By attaching stronger electron-donating and electron-withdrawing groups, and/or increasing the length of the $\pi$-electron system, the absorption band of the corresponding charge-transfer excitations is shifted towards longer wavelengths. There may be an associated increase in the nonlinear optical coefficients. Thus, the second order nonlinear response and placement of the transparent window for optical applications can be tailored by rearranging the groups in the aromatic rings of the NLO molecules. NLO molecules selected with appropriate linear and nonlinear optical properties can be incorporated into a stable noncentrosymmetric organization.

The distribution of donor-acceptor groups and hydroxyl groups in the NLO molecules has a strong effect on the second order properties of the final polymeric system. The NLO molecules are functionalized by attaching photosensitive chromophores to the molecule, so that they can be photocrosslinked. In one embodiment, NLO molecules having diazo-linked $\pi$-extended systems were synthesized by a diazo coupling reaction of aromatic molecules substituted with donor-acceptor groups and hydroxyl groups. Nitro groups and N,N-diethylamine groups were chosen as the donor and acceptor groups, respectively, and were placed at either end of the $\pi$-extended molecule in order to obtain large second order electro-optic effects. The combination is shown in two isomeric structures as Formulae 3 and 4 below wherein R is H. The hydroxyl groups were each attached with a photosensitive chromophore, in this example a cinnamate group, to create a functionalized NLO molecule, shown as Formulae 3a and 4a below, wherein R is the cinnamoyl group, $C_6H_5—CH=CH—CO$.

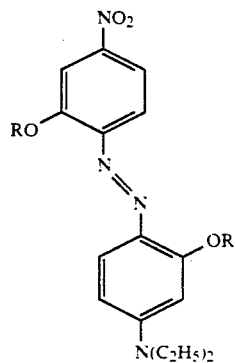

(3) R = H
(3a) R = $—CO—CH=CH—C_6H_5$

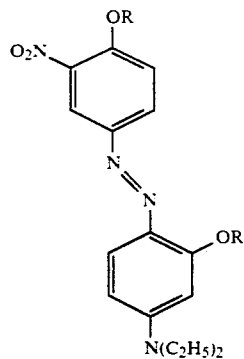

(4) R = H
(4a) R = $—CO—CH=CH—C_6H_5$

In addition to cinnamate, a wide range of photosensitive chromophores are available for making photocrosslinkable functionalized NLO molecules which are useful in the present system, such as styrylacrylate ($C_6H_5—CH=CH—CH=CH—CO_2—$) or chalconeacrylate ($C_6H_5—CO—CH=CH—C_6H_4—CH=CH—CO_2—$). Photosensitive chromophores which are useful in photo-crosslinking reactions are described, for example, by Reiser in: *Photoreactive Polymers*, Wiley & Sons, Inc., New York (1989).

In the present photocrosslinking system, a three-dimensional polymer is produced by a photocrosslinking reaction between the photosensitive functional groups attached to the NLO molecules described above and the same or similar molecules on host polymers. Thus, the structure of the present polymer will depend upon the choice of the functionalized NLO molecule and the host polymer. The term "host polymer" as used herein refers to a polymer having photoreactive groups which are capable of photocrosslinking among themselves or with the photosensitive functional groups on the NLO molecule. Therefore, the choice of host polymer will depend, among other things, upon the functional groups attached to the NLO molecules. For example, if an NLO molecule contains a cinnamate functional group, then the host polymer will be selected to have the same or similar pendant groups which are capable of photocrosslinking with the cinnamate groups, such as polyvinylcinnamate (PVCN). Any polymer having photoreactive $C=C$ moieties can act as a host system. For improved photoreactivity, the double bond should have adequate polarization and light-absorbing characteristics. For example, in PVCN, the adjacent carbonyl group provides a desirable polarization towards the reactivity of the double bonds. The phenyl group in PVCN, on the other hand, increases the polarizability and enhances the light absorbing power of the chromaphore. Polymers which are useful as host polymers include, in addition to PVCN, polymers containing styrylacrylate ($C_6H_5—CH=CH—CH=CH—CO_2—$) or chalconeacrylate ($C_6H_5\ CO—CH=CH—C_6H_4—CH=CH—CO_2—$) groups.

The reaction between a cinnamate-functionalized conjugated NLO molecule and PVCN as the host polymer is used as a model system to illustrate the present invention. In this reaction, crosslinks are formed by 2+2 photodimerization between an excited cinnamoyl group of the host polymer and the ground state cinnamoyl group belonging to the NLO molecule, or vice versa. The photodimerization between the two $C=C$ double bonds of the cinnamoyl groups is very effective because of the adjacent carbonyl group which provides desirable polarization towards the reactivity of the double bond. The phenyl group, on the other hand, increases the polarizability and enhances the light absorbing power of the chromophore. The intermolecular photocrosslinking reaction between the photosensitive chromophores of the polymer and the active NLO molecules is represented schematically in FIG. 1.

Improvement of the relative photosensitivity and spectral sensitivity range in the host polymer beyond those of PVCN is possible by introducing a second double bond into the conjugated olefin-ketone system of the cinnamoyl group, as shown, for example, in Formula 5 below. Certain pyridinium salts, shown as Formula 6, are also known to activate double bonds towards photocrosslinking reactions. The spectral sensitivity range can be controlled by selection of the appropriate R group. For example, in Formula 6, R can be $NO_2$ or $OCH_3$.

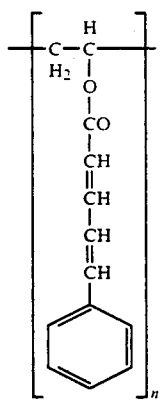

(5)

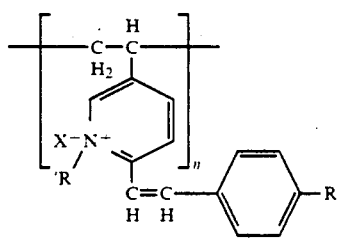

(6)

In the model system used to illustrate the present invention, the NLO molecules are functionalized with cinnamate groups to allow intermolecular photocrosslinking reactions to occur with PVCN. The cinnamoyl group absorbs its maximum at about 280 nanometers (nm), but the crosslink generating photoreaction can be performed albeit, at a slower rate at a wavelength of 254 nm as well. The photocrosslinking reaction can be enhanced, for example, by spectral sensitization by the replacement of the cinnamate group with a chromophore that absorbs at maximum at a longer wavelength, such as styrylacrylate, or by adding a sensitizing agent.

There are a large number of compounds that sensitize PVCN in the near-ultraviolet region and significantly increase the photosensitivity of the composition. For example, thiazolines (N-methylbenzoyl-$\beta$-naphthathiazoline), nitroaromatics (3-nitroacenaphthalene) and ketocoumarins (7-propoxy-3-benzoylcoumarin) represent three major efficient classes of sensitizers among others. They absorb at longer wavelengths and funnel this energy to a reactive site.

An alternative sensitization approach involves the modification of the photosensitive chromophore attached to the host polymer. Traditionally, cinnamate polymers have been prepared by the esterification of polyvinylalchohol, for example, by Delzenne in: *Encyclopedia of Polymer Science and Technology*, Suppl. Vol. 1, pp. 401 J. Wiley & Sons, Inc., New York (1976). Copolymers of PVCN can be prepared for use as host polymers to address particular fabrication requirements. The photocross-linkable units can be made to function at 200 to 700 nm as a result of the judicious use of specific chromophores with specific triplet sensitization. One example of a photocrosslinkable polymer is polyvinyl styrylacrylate (shown as above as Formula 5). This polymer absorbs at longer wavelengths (330 nm) and has a lower triplet energy than cinnamate. Hence, the choice of the photocross-linkable polymer/sensitizer combination permits tailoring of the system to respond to specific light sources and wavelengths.

The present three-dimensional polymers are prepared by the following general procedure. The polymers can be cast in bulk or as films. A conventional spinning technique is employed for illustrative purposes in the present procedure. In this process, thin films of the functionalized NLO molecules and the photosensitive host polymers are coated over substrates such as glass, quartz or thermally grown silicon dioxide on silicon. In this method, the functionalized NLO molecules and the host polymer are dissolved in an organic solvent or solvent mixture. The solution can contain broad ratios of the NLO molecule and the host polymer depending on the properties of the polymer which are desired. The amounts of each can be determined by routine methods. A broad range of solvents may also be used. The choice of solvent will depend upon the solubility of the NLO molecules and host polymers. Polar organic solvents are useful in this process. For PVCN, tetrahydrofuran (THF), 1,4-dioxane, furfural and a toluene:1-chlorobenzene mixture (1:3), can be used for obtaining good quality thin films.

Thin films of the polymers can be produced by spin-coating the solution. Films having a thickness of from about 0.5 $\mu$m to about 2.5 $\mu$m may be easily obtained. Film thickness can be controlled by adjusting the spinning speed and/or the viscosity of the solution.

In another embodiment of the present method, the NLO molecules are attached to the host polymer, and a solution of the NLO-functionalized polymer is spin-coated onto a substrate as described above. The polymer has pendant photoreactive chromophores, and crosslinking takes place between the photoreactive chromophores.

The cast films are allowed to dry, and are then "poled" to introduce noncentrosymmetric organization to the NLO molecules in the film. This can be accomplished, for example by corona poling. Poling can be carried out as described in "Electrets", Sessler (Ed.) Springer-Verland, Berlin, Germany, pp. 3 (1987). This poling temperature is usually close to the glass transition temperature ($T_g$) of the polymer. In the present PVCN system the poling temperature was chosen close to 70° C., which is about 10° C. below the Tg of the polymer. The applied voltage on the corona wire is varied depending on the thickness of the film, concentration of NLO molecules and the temperature selected for poling. The corona current is generally in the range of from about 1.5 to about 3.5 $\mu$A.

The effective poled area, approximately 1.5 cm wide and 2.5 cm long, appears more transparent compared to the unpoled region as the chromophores are aligned normal to the film as a result of poling. The exact process conditions will be specific to the system and can be determined by routine experimentation.

The NLO molecules are then permanently frozen-in into the preferred orientation by crosslinking. Crosslinking is performed photochemically, for example, by UV irradiation. The wavelength of irradiation can be selected depending on the absorption profile of the polymer matrix. In general, almost all films in which PVCN is the host polymer can be photocrosslinked at a wavelength of 254 nm. The crosslinking reaction can be carried out over a wide frequency range of the incident light, for example, light sources rich in the 365 nm line of mercury can be used. Or, an argon-ion laser can be used, with a small quantity of a commercially available triplet sensitizer, such as 7-propoxy-3-benzoylcoumarin. Photocrosslinking can be performed at the late stage of the poling cycle while the electric field is on, or immediately after the poling field is removed.

The refractive index of the film can be measured by ellipsommetry. The index varies as a function of the concentration of NLO molecules in the matrix. Typically, a film of 1.5 μm thickness containing 20% by weight NLO molecules has a refractive index of 1.58 for the poled regions and 1.63 for the unpoled regions in the plane of the film at a wavelength of 532 nm.

The nonlinear optical properties of the poled films can be investigated by using SHG as the probing technique. In this method, measurements are made on a Q-switched Nd-YAG laser in which a polarized beam of light is passed through the sample, and the second-harmonic coefficient of the crosslinked polymer film, $d_{33}$, is obtained. Polymer matrices made by the present method show no decay in SHG over long periods of time at elevated temperatures, for example, ranging from about 60° to 85° C.

In the model system, for example, a Q-switched Nd:YAG laser ($\lambda = 1064$ nm) with a pulse width of 10 nanoseconds (ns) and a pulse energy of 45 millijoules (mJ) was used as the fundamental source, and a reference sample of Y-cut quartz ($d_{11} = 0.364$ pm/V) was used for the calibration of the frequency doubled signal. The second harmonic coefficient of the polymer film, $d_{33}$, of the model system, was obtained from a Maker fringe analysis of the data. Jeophagnon et al., *J. App. Phys.*, 41:1667 (1970). The value of $d_{33}$ varied from 15 to 30 picometers/volt (pm/V) depending on the concentration of NLO molecules. By optimizing the degree of alignment and the concentration of the NLO molecules in the polymer matrix, the second order coefficient can be further varied.

The three-dimensional, nonlinear optical polymers of the present invention have large second order NLO properties. The present polymers exhibit many desirable processing characteristics, such as excellent negative resist and poling and doping features. The present polymers are poled, and photocrosslinked in the poled state to yield a material having excellent optical quality, stable optical nonlinearity and large electro-optic coefficients.

The present NLO polymers can be used in a number of applications, such as second harmonic generation (SHG), frequency mixing, electro-optic modulation, optical parametric emission, amplification and oscillation. The use of polymerc materials having large second order NLO co-efficients, such as the present polymers, is described by R. D. Small et al., in: "Molecular and Polymeric Optoelectronic Materials: Fundamentals and Applications", edited by Khanarian, *SPIE*, 682:160 (1986).

The invention will now be illustrated by the following examples.

EXAMPLES

EXAMPLE 1

The synthetic route for obtaining photosensitive chromophore-substituted diazo dyes is shown schematically in FIG. 2. The following reaction is shown in FIG. 2A. In this reaction, 18.63 g of 2-amino-5-nitrophenol was dissolved in 75 ml of concentrated sulfuric acid and 75 ml of water. 8.34 g of sodium nitrite dissolved in 100 ml of water was slowly added at temperatures below 5° C. To the cooled solution, 115 ml of 2N sodium hydroxide solution with 19.98 g of 3-diethylaminophenol was added and the reaction mixture was stirred overnight at room temperature. The product, 3-hydroxy-4-[4-(N,N-diethylamino)-2-hydroxyphenylazo] nitrobenzene, shown above as Formula 3 (wherein R = H), was filtered, washed with water and dried under vacuum at 60° C. The dye was purified by crystallization from chloroform.

Cinnamoyl chloride (3.15 g) in 10 ml THF was added dropwise to a solution of 1 (3.12 g) and triethylamine (3 g) in THF (10 ml) and stirred for 12 h at room temperature. The solvent was removed under reduced pressure, the residue was dissolved in dichloromethane, washed with water and dried over magnesium sulfate (MgSO$_4$). The product, 3-cinnamoyloxy-4-[4-(N,N-diethylamino)-2-cinnamoyloxyphenylazo] nitrobenzene, shown above as Formula 3a, was purified by column chromatography (silica gel, THF as eluent) as a deep red solid.

1 g of PVCN and 0.2 g of 1a were dissolved in 5 ml of 1,4-dioxane using an ultrasonic mixer at 35° C. The resulting solution was used to spin-coat a glass substrate at 1250 to 4000 rpm for 1 min. Prebaking of the sample was done immediately after spin-coating at 60° C. for 12 hours.

The substrate was kept on the hot-stage of the poling equipment for 1 minute at 60° C. prior to the poling, and photocrosslinking cycles. The film was corona poled for 3 min. The applied voltage on the corona wire was maintained at 6 kV while the corona current of approximately 2 μA was established. The poled film was then cross-linked for 10 minutes by UV irradiation. A radiation dosage of 2.5 to 3 mW/cm$^2$ at wavelength 254 mn was maintained during the crosslinking reaction. Sudden cooling of the substrate was done after UV irradiation by passing cold water through the hot-stage. The poling field was kept on during both the radiation and cooling cycles.

Figure 3:
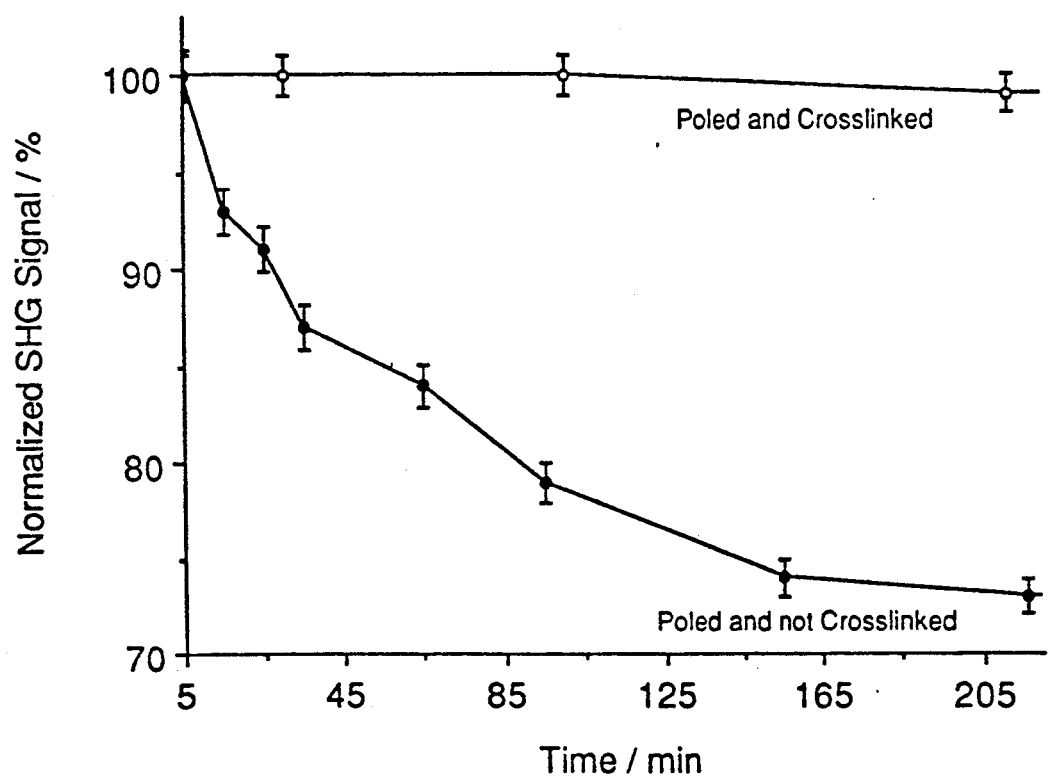
FIG. 3 is a graph illustrating the stability of a poled PVCN film crosslinked with 3-cinnamoyloxy-4-[4-(N,N-diethylamino)-2-cinnamoyloxyphenylazo] nitrobenzene compared to a poled and noncrosslinked PVCN film with the same compound.

The results are shown in Table 2 below, and in FIG. 3. As shown in FIG. 3, the poled PVCN film crosslinked with compound 3a is much more stable than a poled, uncrosslinked PVCN film.

TABLE 2

| Optical properties of PVCN film doped with 3a | | |
|---|---|---|
| | PVCN/3a (10%) | PVCN/3a (20%) |
| Thickness (μm) | 0.5 | 0.5 |
| Abs. max (nm) | 520 | 520 |
| $T_g$ (°C.)$^a$ | 84 | 81 |
| Refractive index | | |
| λ (μm) | | |
| 0.532 | 1.632 | 1.634 |
| 0.632 | 1.677 | 1.685 |
| 1.000 | 1.613 | 1.625 |
| $d_{33}$ (pm/V)$^b$ | 11 | 16.5 |

$^a$Obtained from DSC (DuPont 2910 differential scanning calorimeter). 10° C./min (midpoint). $T_g$ of PVCN is 88° C.
$^b$$d_{33}$ not corrected for absorption.

EXAMPLE 2

The following reaction is shown schematically in FIG. 2B. In this reaction, 15.41 g of 4-amino-2-nitrophenol was dissolved in 60 ml of concentrated sulfuric acid and 60 ml of water. 6.9 g of sodium nitrite dissolved in 100 ml of water was slowly added at temperatures below 5° C. To the cooled solution, 100 ml of 2N sodium hydroxide solution with 16.52 g of 3-diethylaminophenol was added and the reaction mixture was stirred overnight at room temperature. The product, 6-hydroxy-3-[4-(N,N-diethylamino)-2-hydroxyphenylazo] nitrobenzene, shown as Formula 4 above (wherein R=H), was filtered, washed with water and dried under vacuum at 60° C. The dye was used purified by column chromatography over silica gel (using dichloromethane/diethylether[1:1] as eluent) as a pink crystal.

Cinnamoyl chloride (1.02 g) in 5 ml THF was added dropwise to a solution of dye 2 (1 g) and triethylamine (0.77 g) in THF (10 ml) and stirred for 12 h at room temperature. The solvent was removed under reduced pressure, the residue was dissolved in dichloromethane, washed with water and dried (MgSO$_4$). The product, 6-cinnamoyloxy-3-[4-(N,N-diethylamino)-2-cinnamoyloxyphenylazo] nitrobenzene, shown as Formula 4a above, was purified by column chromatography (silica gel, THF as eluent) as an orange solid.

1 g of PVCN and 0.2 g of 4a were dissolved in 5 ml of 1,4-dioxane using an ultrasonic mixer at 35° C. The resulting solution was used to spin-coat a glass substrate at 1250 to 4000 rpm for 1 min. Prebaking of the sample was done immediately after spin-coating at 60° C. for 12 hours.

The substrate was kept on the hot-stage of the poling equipment for 1 minute at 60° C. prior to poling and photocross-linking cycles which were 3 min and 10 min, respectively, as described in Example 1. The applied voltage on the corona wire was maintained at 6 kV while the corona current of approximately 2 μA was established. A radiation dosage of 2.5 to 3 mW/cm$^2$ at wavelength 254 nm was maintained during the cross-linking reaction. Sudden cooling of the substrate was done after UV irradiation by passing cold water through the hot-stage. The poling field was kept on, during both the radiation and cooling cycles. The cross-linked polymer film was much more stable than a non-crosslinked sample of the film.

Equivalents

Those skilled in the art will recognize, or be able to ascertain using no more than routine experimentation, many equivalents to the specific embodiments of the invention described herein. Such are intended to be encompassed by the following claims.

We claim:

1. A photocrosslinkable nonlinear optical polymer composition, comprising:
   a) a nonlinear optical component which includes at least two photosensitive functional groups; and
   b) a host polymer component which includes a plurality of photosensitive functional groups, whereby, during exposure of the photocrosslinkable nonlinear optical polymer composition to sufficient electromagnetic radiation, at least two of the photosensitive functional groups of the host polymer component react with at least two of the photosensitive functional groups of the nonlinear optical component to cause the nonlinear optical component to crosslink with the host polymer component, thereby forming a photocrosslinked nonlinear optical polymer.

2. A composition of claim 1 wherein the nonlinear optical component includes a nonlinear optical compound having an organic moiety, an electron-donating group bonded to the organic moiety, and an electron-accepting group bonded to the organic moiety.

3. A composition of claim 2 wherein the organic moiety includes an aromatic ring structure.

4. A composition of claim 2 wherein the electron-donating group of the nonlinear optical molecule is selected from the group consisting of amine, ethylamine, methoxy and ethoxy functional groups.

5. A composition of claim 4 wherein the electron-accepting group of the nonlinear optical molecule is selected from the group consisting of nitro, nitroso, cyano and pyridinium salt functional groups.

6. A composition of claim 5 wherein the photosensitive functional groups of the nonlinear optical component are selected from the group consisting of cinnamates, styrylacrylates and chalconeacrylates.

7. A composition of claim 6 wherein the nonlinear optical molecule includes an extended $\pi$-conjugated moiety.

8. A composition of claim 7 wherein the extended $\pi$-conjugated moiety is selected from the group consisting of stilbene dyes, azomethine dyes and diazo dyes.

9. A composition of claim 8 wherein the photosensitive functional groups include a photoreactive carbon-carbon double bond.

10. A composition of claim 9 wherein the host polymer component includes a homopolymer.

11. A composition of claim 10 wherein the host polymer component is selected from the group consisting of polyvinylcinnamate, polyvinylstyrylacrylate and polyvinylchalcone.

12. A composition of claim 11 further comprising a spectral sensitizing agent.

13. A composition of claim 12 wherein the spectral sensitizing agent is selected from the group consisting of thiazolines, nitroaromatics and ketocoumarins.

14. A composition of claim 9 wherein the host polymer component includes a copolymer.

* * * * *

UNITED STATES PATENT AND TRADEMARK OFFICE
CERTIFICATE OF CORRECTION

PATENT NO. : 5,112,881
DATED : May 12, 1992
INVENTOR(S) : Braja K. Mandal, Sukant K. Tripathy, Jan-Chan - Huang and Jayant Kumar It is certified that error appears in the above-indentified patent and that said Letters Patent is hereby corrected as shown below:

Column 1, line 4,

--<u>Government Funding</u>

This invention was made with support from the Government, Contract No. ONR 06-5485-F, which has certain rights in the invention.--

Signed and Sealed this

Twenty-fifth Day of June, 1996

BRUCE LEHMAN

*Attest:*

*Attesting Officer*    *Commissioner of Patents and Trademarks*